US008926127B2

(12) United States Patent
Sinofsky

(10) Patent No.: US 8,926,127 B2
(45) Date of Patent: Jan. 6, 2015

(54) LIGHTWEIGHT SOLID STATE LIGHTING PANEL

(76) Inventor: Edward Lawrence Sinofsky, Dennis, MA (US)

( * ) Notice: Subject to any disclaimer, the term of this patent is extended or adjusted under 35 U.S.C. 154(b) by 88 days.

(21) Appl. No.: 13/520,602

(22) PCT Filed: Jan. 13, 2011

(86) PCT No.: PCT/US2011/021102

§ 371 (c)(1), (2), (4) Date: Jul. 5, 2012

(87) PCT Pub. No.: WO2011/088190

PCT Pub. Date: Jul. 21, 2011

(65) Prior Publication Data

US 2012/0281407 A1 Nov. 8, 2012

Related U.S. Application Data

(60) Provisional application No. 61/336,148, filed on Jan. 15, 2010.

(51) Int. Cl.

| | |
|---|---|
| ***F21V 7/00*** | (2006.01) |
| ***H01L 33/60*** | (2010.01) |
| ***F21S 8/00*** | (2006.01) |
| ***F21S 8/04*** | (2006.01) |
| ***F21V 13/04*** | (2006.01) |
| *F21Y 101/02* | (2006.01) |

(52) U.S. Cl.

CPC .. *F21S 8/033* (2013.01); *F21S 8/04* (2013.01); *F21V 7/0008* (2013.01); *F21V 13/04* (2013.01); *F21Y 2101/02* (2013.01)

USPC ............................ 362/247; 362/612; 362/613

(58) Field of Classification Search

CPC .............. F21V 13/04; F21S 8/033; F21S 8/04

See application file for complete search history.

(56) References Cited

U.S. PATENT DOCUMENTS

| | | | | |
|---|---|---|---|---|
| 6,840,652 | B1 * | 1/2005 | Hymer | 362/235 |
| 7,055,991 | B2 * | 6/2006 | Lin | 362/311.02 |
| 7,121,690 | B1 * | 10/2006 | Ramer et al. | 362/297 |
| 2002/0027779 | A1 * | 3/2002 | Cassarly et al. | 362/231 |
| 2006/0152932 | A1 * | 7/2006 | Wu | 362/327 |
| 2008/0074901 | A1 * | 3/2008 | David et al. | 362/612 |

FOREIGN PATENT DOCUMENTS

| | | | |
|---|---|---|---|
| JP | 2006-504116 | A | 2/2006 |
| JP | 2007-148177 | A | 6/2007 |
| JP | 2008-547173 | A | 12/2008 |

OTHER PUBLICATIONS

Notification Concerning Transmittal of Copy of International Preliminary Report on Patentability and Written Opinion of the International Searching Authority in International Application No. PCT/US2011/021102 (date mailed Jul. 26, 2012).

Notification of Transmittal of the International Search Report and the Written Opinion of The International Searching Authority, or The Declaration in International Application No. PCT/US2011/021102 (date mailed Sep. 30, 2011).

* cited by examiner

*Primary Examiner* — Elmito Breval

(74) *Attorney, Agent, or Firm* — Thomas J. Engellenner; Reza Mollaaghababa; Pepper Hamilton LLP

(57) ABSTRACT

A highly efficient, lightweight solid state lighting panel is disclosed that has multiple LED sources, and emits a substantially uniform light intensity between said sources. The light from these sources is directed towards a highly reflective, diffusive, backing. These LED sources are placed between the reflector and a partially transmissive, partially reflective output coupler to form a cavity. The LEDs, which are mounted to printed circuit boards to form strips, can be either attached to the inner surface of the diffuser with adhesive, or suspended on a thermally dissipative structure within the cavity. By optimizing the reflector to have as high of a reflectance value as possible (>95%) along with a output diffuser with about 50% transmission and 50% reflection, one can obtain cavity transmissions higher than 90%. The output from this disclosed design is more pleasant to look at than those with LEDs that directly illuminate the diffuser, causing hotspots.

22 Claims, 4 Drawing Sheets

LIGHTWEIGHT SOLID STATE LIGHTING PANEL

RELATED APPLICATION

This application is the U.S. National Stage of International Application No. PCT/US2011/021102, filed 13 Jan. 2011, which designates the U.S., published in English, and claims the benefit of U.S. Provisional Application No. 61/336,148, filed Jan. 15, 2010. The entire teachings of the above applications are incorporated herein by reference.

BACKGROUND

Popular conventional lighting panels use either incandescent or fluorescent light sources. Conventional light fixtures are fragile, heavy in weight, difficult to manufacture, and have many replacement components such as ballasts, which are potential failures in addition to the fluorescent bulb.

In contrast, contemporary light sources, such as light emitting diodes, are substantially lighter in weight, more energy efficient and gradually age, rather than catastrophically fail. When the thermal and electronic drive characteristics are properly managed, light-emitting diode (LED) products are predicted to still deliver an average of 70% of initial intensity after 50,000 hours of operation, which at 12 hours per day, 365 days per year, amounts to a lifetime of 11 years. The direct nature of LEDs can result in efficiencies approaching 200 lumens per watt of electric power.

LEDs have many other desirable features. They are fully dimmable without color variation. They instantly turn on, have full color, and emit more light and less heat than other sources. LEDs can be sorted for photometric luminous, flux (in lumens), color, wavelength, and forward voltage. They are also extremely durable, and contain no harmful mercury vapors, such as those used in fluorescent light sources.

LED benefits are based on good thermal system design to achieve the best efficiency and reliability. The LED absolute maximum thermal ratings should be maintained for LED junction and printed circuit board temperature. The temperature of an LED should be managed in order to achieve the LED's maximum rated life. Thermal resistance causes a temperature difference between the source of the heat and the exit surface for heat. The less heat retained by the LED, the better its performance and the longer its lifetime. Despite the advantages of LEDs over other light sources, current designs have several problems.

Contemporary LED lighting panels are of two designs: One is waveguide-edge illumination with the light directed into a transparent or translucent waveguide and the LEDs placed along the perimeter of a panel. These panels are quite heavy (a 2'×2' waveguide weighs 6-12 lbs.) and require the LEDs with the incumbent thermal loading on the perimeter. The need to use high power LEDs, due to the limited perimeter available, further exacerbates the thermal problem. The second is direct illumination with the light output from the LED die pointed towards a diffusive panel some distance away. In its simplest form, the LEDs deliver an intensity profile to the observer with many hot spots, which is unpleasant to look at. To eliminate this unpleasant look, diffuser panels are often used to soften the glare. The highest amount of softening is seen with the lowest value of transmission. These diffusers lower the efficiency of the panels' output due to this low transmission. In order to achieve a reasonably uniform illumination, complex optics and a substantial depth must be provided. This configuration—with the LEDs mounted on a top panel complicates the LEDs and the thermal management of the environment by concentrating the waste heat in the closed space between the fixture and the ceiling.

SUMMARY

Embodiments of the present invention include LED lighting panels (luminaires), methods of making LED lighting panels, and methods of illuminating environments with LED lighting panels. In one example, the inventive lighting panel includes a reflective surface disposed opposite to and spaced apart from a partially transmitting, partially reflecting diffusive coupler. Together, the reflective surface and the diffusive coupler define a cavity that contains LEDs whose positions within the cavity are selected to provide substantially uniform illumination (e.g., illumination whose intensity varies by about ±15% or less) between adjacent LEDs. Turning on the LEDs causes the LEDs to emit light towards the reflective surface and away from the diffusive coupler. The reflective surface reflects the light towards the diffusive coupler, which reflects a portion of the incident light back towards the reflective surface and transmits another portion of the incident light into the illuminated environment.

The LEDs may be mounted on strips which are separated from each other by a distance x. In these examples, the reflective surface and the diffusive coupler are spaced apart by a distance $t=(x/2)/\tan\alpha$, where $\alpha$ is an angle within a range of about 30° and about 60°, or, more preferably, within a range of between about 50 and about 55°. The LEDs and LED strips can also be mounted on heat-dissipating elements that dissipate heat generated by the LEDs into the environment illuminated by the lighting panel. In some cases, the heat-dissipating elements are secured with mechanical standoffs at positions spaced apart from the diffusive coupler.

Typically, each inventive lighting panel includes a reflective surface whose reflectivity is at least about 95% (e.g., about 97%) across the visible spectrum. Each inventive lighting panel can also include a diffusive coupler that is about 50% reflective and about 50% transmissive across the visible spectrum. Inventive lighting panels may also include a second partially transmitting, partially reflecting diffusive coupler that is disposed opposite to and spaced apart from the first diffusive coupler to define a second cavity between the first diffusive coupler and the environment. Some of the light transmitted by the first diffusive coupler reflects off the second diffusive coupler back towards the reflective coupler. The rest of the light transmitted by the first diffusive coupler propagates through the second diffusive coupler to provide substantially uniform illumination to the environment.

An inventive lighting panel can be made by forming a reflective surface, disposing more than one LED opposite the reflective surface for emitting light towards the reflective surface, and disposing a partially transmitting, partially reflecting diffusive coupler opposite to and spaced apart from the reflective surface to form a cavity containing the LEDs. The cavity can be formed before or after the LEDs are disposed opposite the reflective surface, which can be formed by coating a substrate with a reflective coating having a reflectivity of at least about 95% (or, more preferably, about 97%) across the visible spectrum.

The LEDs are spaced apart from each other by a distance x, and the distance between the diffusive coupler and the reflective surface is $t=(x/2)/\tan\alpha$, where $\alpha$ is an angle within a range of about 30° and about 60°, e.g., within a range of between about 50° and about 55°. If desired, a second diffusive coupler can be disposed opposite to and spaced apart from the diffusive coupler and the reflective surface to define a second cavity. The first and second cavities can be sealed to minimize cleaning and maintenance costs.

Embodiments of the present invention overcome issues associated with other LED lighting panels while retaining the advantages of LED illumination. By directing the LED output away from the observer to the upper interior diffuse reflective optical surface, the inventive LED lighting panels provide a diffuse illumination pattern that is much less harsh than the illumination patterns provided by LEDs oriented towards the illuminated environment, and appears substantially uniform between sources. Multiple reflections within the cavity formed by the reflective surface and the diffusive coupler distribute light more uniformly across the output of the panel, creating a more pleasant illumination at efficiencies of over 90%. Inventive LED panels with a second diffusive coupler can provide a substantially uniform illumination pattern, with less visualization of the strip shadow. When mounted on a ceiling or wall, the inventive lighting panels direct heat generated by the LEDs away from the ceiling or wall and towards the illuminated space, reducing the thermal load on the ceiling or wall, or dissipates it within the unit by a thermal frame. As a result, ceilings and walls with inventive lighting panels can be insulated more thoroughly to reduce heating costs. In addition, the same air conditioning that cools the illuminated room can be used to cool the lighting panel during the hot season.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF PREFERRED EMBODIMENTS

A description of example embodiments of the invention follows. The teachings of all patents, published applications, and references cited herein are incorporated by reference in their entirety.

Embodiments of the present invention relate to a lightweight LED fixture/panel which may be specifically adapted to drop ceiling grids or other structures of any size, geometric shape, flat, formed or combination thereof. The fixtures/panels may be drop panels. More particularly, inventive embodiments include an LED lighting system having a novel construction enabling high efficiency, light weight, a directed thermal signature into a climate-controlled environment, and substantially uniform spatial light emission between the sources.

Figure 1:
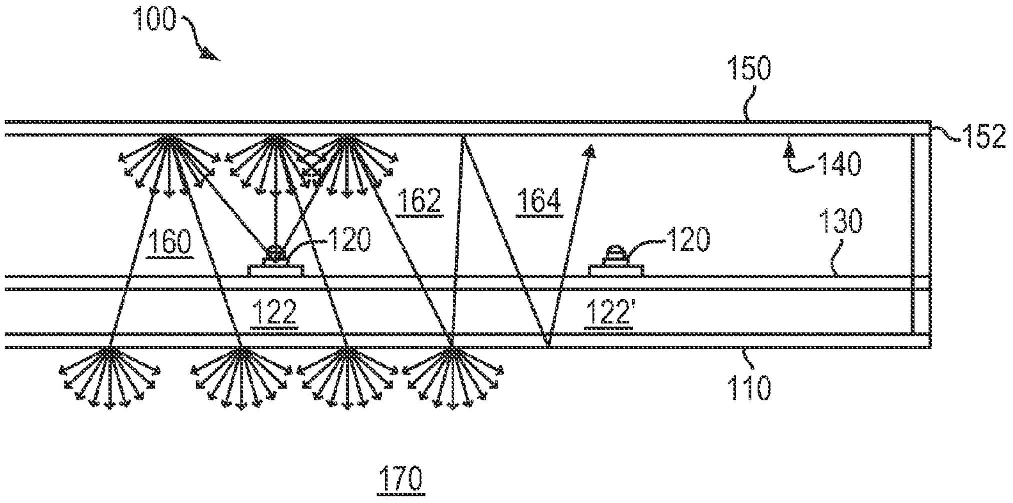
FIG. 1 is a side view of a preferred embodiment of the present invention having an intermediate light source element.

FIG. 1 is a simplified schematic side view of a light-emitting diode (LED) light fixture/panel 100 provided in accordance with the present invention shown in a configuration for a drop ceiling installation having a bottom transmissive diffusing panel 110, also known as a diffusive coupler 110, an intermediately positioned LED light source elements 120 arranged in adjacent linear arrays 122, 122' and affixed to a supporting frame 130 and a top diffuse reflective surface 140 which may be a surface of the top panel 150. (The supporting frame 130 can itself be made of the same diffusive, partially transmitting, partially reflecting material used to form the diffusive 110. That is, the supporting frame 130 can act as a second diffusive coupler.) A supporting perimeter frame 152 supports and dictates the spacing of the diffusive coupler 110, the reflective surface 140, and the supporting frame 130. The supporting perimeter frame 152 may also be sealed and impervious to dust and water, reducing maintenance costs and increasing fixture life.

In operation, light 160 from the light source elements 120 is directed towards the top reflective diffuse surface 140 where it is diffusively reflected towards the bottom transmissive diffusing panel 110. The bottom transmissive panel 110 diffusively transmits a percentage of the light 160 into an illuminated environment 170, and reflects a percentage of light 162 back towards the top reflective surface 140. The first reflected light 162 is again reflected from the top reflective surface 140 and a percentage of this light 162 is transmitted into the environment 170. A percentage of first reflected light 162 is again reflected by the bottom panel 110 towards the top reflective surface 140 and returned to the cycle as second reflected light 164. If absorption in the cavity is kept low, this cycle of transmission and reflection may continue until a substantial percentage of the light is transmitted into the environment 170. The efficiency of inventive LED panels may be further improved by affixing another reflective surface to the bottom of the panels and other non-emissive surfaces of the supporting frame 130 and perimeter 152 frames.

By manufacturing a bottom transmissive panel 110 that has a low coefficient of light absorption, preferably less than 1%, and a top reflective diffuse surface 140 with a high reflectivity, preferably greater than 97%, overall efficiencies of greater than 90% may be achieved. The percent transmission of the bottom panel 110 matters, and 50% transmission appears to near optimum. Bottom panels with reflectivities of 70% and transmissivities of about 30% are also possible.

In a preferred embodiment, the bottom transmissive panel (diffusive coupler) 110 is formed of 2447 white colored acrylic and the top reflective surface 140 is formed of aluminum, steel, or polyvinyl chloride (PVC) coated with WhiteOptics™ Reflector (e.g., White97™ Film) or another suitable reflective coating. For more details of suitable reflective coatings, see, e.g., U.S. application Ser. No. 12/728,160 to Eric Teather, which is incorporated herein by reference in its entirety.

In an exemplary description of the manufacturing of the disclosed panel, one first obtains high efficiency LED strips from an LED manufacturer, and adheres the LED strips to the inside of the diffusive coupler, with the designed spacing. The electrical input to the multiple strips is soldered to a parallel bus circuit board that distribute the electrical energy to the strips. A reflective backing is prepared by sticking a White Optics reflector sheet to a foamed PVC backing, such as Sintra, formed to the desired cavity depth. The backing and the diffusive coupler are brought together with adhesive, after a power cord is attached to the parallel bus. The unit is then energized and the output is tested. If it passes testing, an edging is applied around the unit to further seal it and to protect the edges.

The proper spacing of the light source elements 120, the bottom panel 110 and the top surface 140 provides optimum performance and the most pleasant looking output to the observer. In an embodiment of light source elements 120 as shown in FIG. 1, the spacing of the linear light arrays 122, 122' is dependent on their angular spatial distribution.

Figure 2:
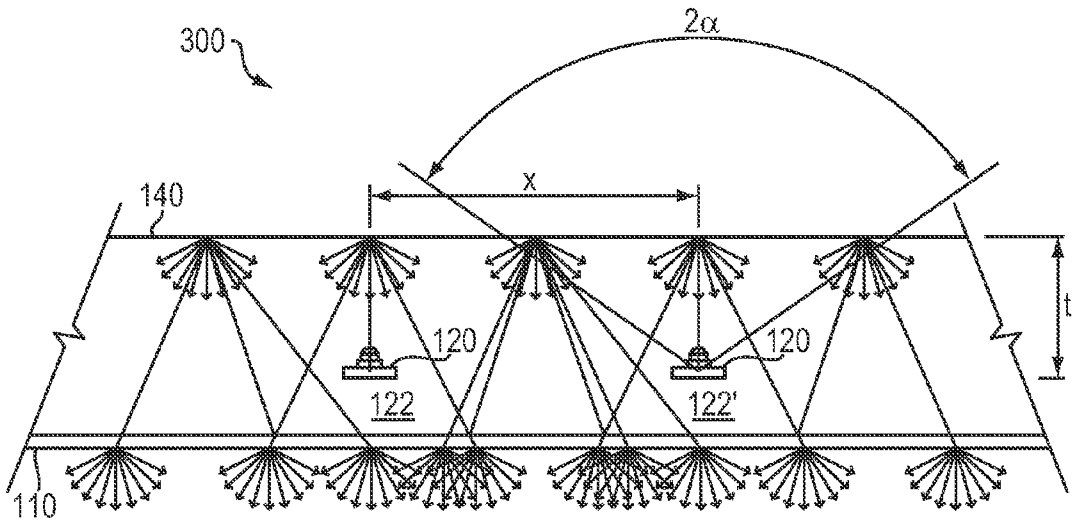
FIG. 2 is a schematic side view of another embodiment of the present invention having a bottom, composite light source element.

FIG. 2 shows an inventive panel 300 that includes linear strips 122, 122' that are rigid enough to support the LEDs 120 in the cavity between the diffusive coupler 110 and the reflective surface 140 without an additional supporting frame. Sufficiently rigid linear strips 122, 122', such as those made of or supported with aluminum or printed circuit board (PCB) substrate, are mechanically connected to the panel's peripheral frame, e.g., with standoffs or other suitable connections. Preferred panels include rigid strips 122, 122' that are suspended within the cavity between the diffusive coupler 110 and reflective surface 140 at a height sufficient to prevent shadows from appearing in the illumination pattern as described below.

FIG. 2 also illustrates the spacing of adjacent LEDs 120 according to the formula, $t=(x/2)/\tan\alpha$, where t is the separation distance between the reflective surface 140 and the LEDs 120, x is the distance between adjacent strips 122, 122', and $\alpha$ is an angle within a range between about 30 and about 60°. The angle $\alpha$ is normally the point in the LEDs distribution where the light intensity has dropped to about 60% of the on axis intensity. In other words, when viewed from an angle $\alpha$, the LED elements 120 appear to emit about 60% as much light as they appear to emit when viewed head on. As an example, a 2'×2' panel suitable for use in a suspended ceiling may include ten evenly separated strips 122, 122' with approximately two inches between adjacent strips 122, 122'. Applying the above formula yields separation between the sources 120 and the top diffuse reflector 140 of about $$t=\frac{(2''/2)}{\tan 50^\circ}=0.84''.$$

Moving the LEDs 120 closer together does not affect the uniformity of the illumination pattern, but decreasing the distance from the LEDs 120 to the reflector 140 causes a visible darkening between sources 120, which is unpleasant to the viewer. Economically, one would like to have the fewest number of strips, hence the largest separation between strips for a given cavity depth.

Figure 3:
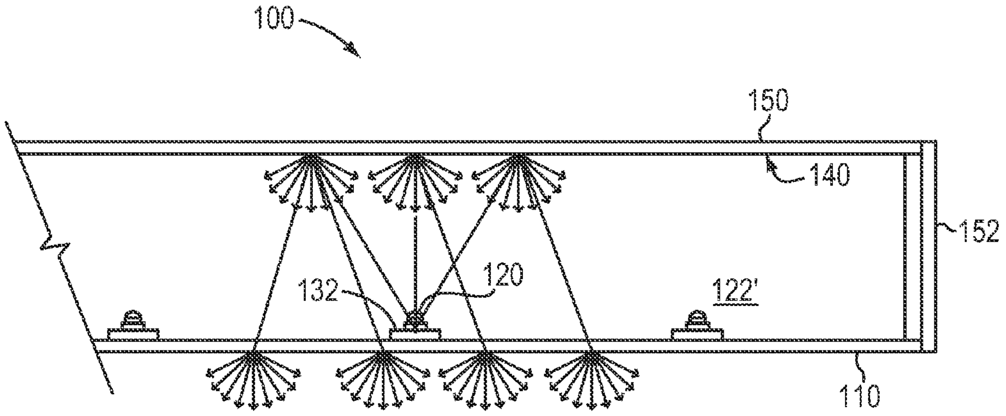
FIG. 3 is a schematic side view of another embodiment of the present invention having a bottom, composite light source element with a top integrated wall-diffuser element.

FIG. 3 is a simplified schematic side view of a thermal-dissipating embodiment of the present invention having a bottom, composite light source element shown in a configuration for a drop ceiling installation having a bottom transmissive diffusing panel 110, a bottom-positioned LED light source elements 120 affixed to a heat-dissipating element 132, and a top diffuse reflective surface 140 which may be a surface of the top panel 150. Each composite light source comprises LEDs 120 affixed to a particular heat-dissipating element 132. In operation, the heat-dissipating element 132 distributes the heat generated by the light source elements 120 throughout its volume and more evenly transfers the heat to the interior space and bottom panel 110. In preferred embodiments, the heat-dissipating element 132 is made of PCB substrate, aluminum, or another suitable thermally conductive material. Sufficiently rigid heat-dissipating elements 132 may be used to support the LEDs 120 above the diffusive coupler as described above with respect to FIG. 2.

Inventive lighting panels are lighter, thinner, and provide higher light intensity at substantially lower fabrication and maintenance costs than prior art luminaires. They also dissipate heat into the illuminated environment instead of into the ceiling space. In winter when heating the room, the LEDs 120 help modestly heat the room. In the summer when the room is cooled, the LEDs 120 are subject to a lower ambient temperature than that in the space above the ceiling, which increases both the efficiency and lifetime of the LEDs 120. Dissipating the heat into the room also allows for thermal insulation to be placed on top of the panel in the ceiling space to further insulate the room.

FIG. 3 also shows how construction of inventive lighting panels may be further simplified by manufacturing an integrated top panel 150 and perimeter frame 152, 152'. In operation, the perimeter frame 152, 152' incorporates supports and attachment elements for the LED strips 122, 122' and bottom panel 110. The full interior surface of the lighting panel may be diffusely reflective 140. The diffusive coupler 110, top panel 150, and perimeter frame 152, 152', may be sealed to provide a dust- and waterproof cavity for the LEDs 120. The perimeter frame 152, 152' may also dissipate heat that is transmitted from the LEDs 120 via the strips 122, 122'.

Figure 4:
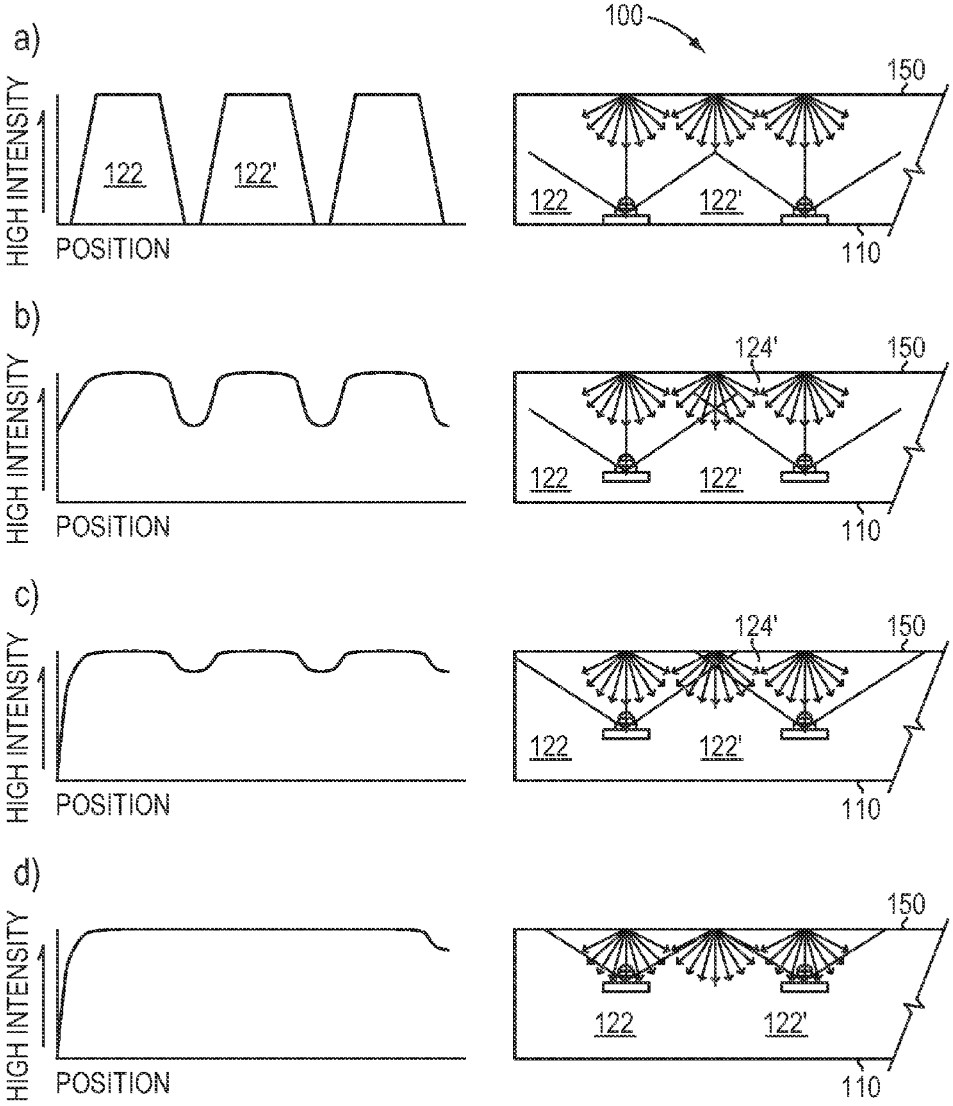
FIGS. 4A-4D are graphic representations of the spatial light distribution when varying the relative spacing of the elements of a preferred embodiment.

FIGS. 4A-4D are graphical representations of spatial light distributions of preferred embodiments where the spacing of the light source arrays 122, 122', the bottom panel 110, and the reflective surface 140 are selected to produce illumination patterns that are substantially uniform between adjacent arrays 122, 122'. That is, the light arrays 122, 122' are positioned to emit patterns that vary in intensity by about ±15% or less between adjacent arrays 122, 122'. Variations in intensity of ±15% or less are hard for the human eye to discern. Varying the relative and absolute distances of the linear light arrays 122, 122' from the bottom panel 110 and the reflective surface 140 affects the visibility of shadows cast by the arrays 122, 122'. The generalized effect is shown in the corresponding graph of intensity versus position where FIG. 4A shows the shadow when the arrays 122, 122' are affixed to the bottom panel 110 occluding the bottom panel 110, and FIG. 4D shows a uniform intensity where the spacing is optimized to eliminate the visible shadow due to the LED strips 122, 122'.

While this invention has been particularly shown and described with references to example embodiments thereof, it will be understood by those skilled in the art that various changes in form and details may be made therein without departing from the scope of the invention encompassed by the appended claims.

What is claimed is:

1. A lighting panel comprising:

a reflective surface;

a partially transmitting, partially reflecting diffusive coupler disposed opposite to and spaced apart from the reflective surface to define a cavity; and light-emitting diodes (LEDs) disposed at positions within the cavity and configured to emit light towards the reflective surface and away from the diffusive coupler, the positions of the LEDs being selected to provide substantially uniform illumination between adjacent LEDs, wherein the reflective surface and the LEDs are spaced apart by a distance $t=(x/2)/\tan\alpha$, where x is a distance between adjacent LEDs and $\alpha$ is an angle within a range of about 30° and about 60°.

2. The lighting panel of claim 1 wherein the LEDs are mounted on the diffusive coupler, and the reflective surface and the diffusive coupler are spaced apart by a distance t=(x/2)/tan α, where x is a distance between adjacent LEDs and α is an angle within a range of about 30° and about 60°.

3. The lighting panel of claim 2 wherein α is an angle within a range of about 50° and about 55°.

4. The lighting panel of claim 1 wherein the reflective surface has a reflectivity of at least about 95% across the visible spectrum.

5. The lighting panel of claim 1 wherein the diffusive coupler has a reflectivity within a range of about 50% and about 70% and a transmissivity within a range of about 50% and about 30%.

6. The lighting panel of claim 1 wherein the diffusive coupler is a first diffusive coupler and wherein the reflective surface is opposite a first side of the first diffusive coupler, and further including:

a second partially transmitting, partially reflecting diffusive coupler disposed opposite to and spaced apart from a second side of the first diffusive coupler to define a second cavity.

7. The lighting panel of claim 1 wherein the LEDs are mounted on heat-dissipating elements configured to dissipate heat from the LEDs within the lighting panel or to an environment illuminated by the lighting panel.

8. The lighting panel of claim 7 wherein the heat-dissipating elements are spaced apart from the reflective surface with mechanical standoffs.

9. A method of illuminating an environment, the method comprising:

(a) supporting light-emitting diodes (LEDs) at positions within a cavity defined by a reflective surface and a partially transmitting, partially reflecting diffusive coupler, the positions selected to provide a substantially uniform illumination between the LEDs, wherein the reflective surface and the LEDs are spaced apart by a distance t=(x/2)/tan α, where x is a distance between adjacent LEDs and α is an angle within a range of about 30° and about 60°;

(b) emitting light from the LEDs towards the reflective surface and away from the diffusive coupler;

(c) reflecting the light incident on the reflective surface towards the diffusive coupler;

(d) reflecting a first portion of the light from the diffusive coupler towards the reflective surface; and (e) transmitting a second portion of the light into the environment via the diffusive coupler to provide a substantially uniform illumination between the LEDs.

10. The method of claim 9 wherein the LEDs the LEDs are mounted on the diffusive coupler, and are spaced apart from each other by a distance x, and wherein the reflective surface and the diffusive coupler are spaced apart by a distance t=(x/2)/tan α, where α is an angle within a range of about 30° and about 60°.

11. The method of claim 9 wherein α is an angle within a range of about 50° and about 55°.

12. The method of claim 9 wherein supporting the LEDs further includes supporting the LEDs at positions spaced apart from the diffusive coupler.

13. The method of claim 9 wherein transmitting the second portion of light into the environment includes (i) reflecting some of the second portion of the light from another partially transmitting, partially reflecting diffusive coupler and (ii) transmitting some of the second portion of the light into the environment via the other diffusive coupler.

14. The method of claim 9 further including coupling heat generated by the at least one LED into the environment.

15. A method of making a lighting panel, the method comprising:

(a) sealing a perimeter of a top reflective surface to a frame;

(b) sealing a partially transmitting, partially reflecting diffusive coupler opposite to the top reflective surface at a bottom-most end of the frame, the diffusive coupler being spaced apart from the reflective surface to form a cavity; and (c) disposing light-emitting diodes (LEDs) oriented to emit light towards the reflective surface at positions within the cavity, wherein the reflective surface and the LEDs are spaced apart by a distance t=(x/2)/tan α, where x is a distance between adjacent LEDs and α is an angle within a range of about 30° and about 60°; to provide substantially uniform illumination between adjacent LEDs.

16. The method of claim 15 wherein forming the reflective surface includes disposing reflective material on a substrate, the reflective material having a reflectivity of at least about 95% across the visible spectrum.

17. The method of claim 15 wherein disposing LEDs opposite the reflective surface includes disposing LEDs on the diffusive coupler and spaced apart from each other by a distance x, and wherein disposing the diffusive coupler opposite and spaced apart from the reflective surface includes disposing the diffusive coupler at a distance t=(x/2)/tan α from the reflective surface, where α is an angle within a range of about 30° and about 60°.

18. The method of claim 17 wherein α is an angle within a range of about 50° and about 55°.

19. The method of claim 15 wherein disposing the LEDs further includes disposing the LEDs at positions spaced apart from the diffusive coupler.

20. The method of claim 15 further including disposing another partially transmitting, partially reflecting diffusive coupler opposite to and spaced apart from the diffusive coupler and the reflective surface to define a second cavity.

21. The method of claim 15 further including sealing the cavity formed between the reflective surface and the diffusive coupler.

22. The method of claim 15 further including disposing the at least one LED in thermal contact with a thermally dissipating element configured to dissipate heat away from the reflective surface.

* * * * *